(12) United States Patent
D'Abramo et al.

(10) Patent No.: US 7,474,162 B2
(45) Date of Patent: Jan. 6, 2009

(54) RC-OSCILLATOR CIRCUIT

(75) Inventors: Paolo D'Abramo, Civitavecchia (IT);
Riccardo Serventi, Pietrasanta (IT)

(73) Assignee: Austriamicrosystems AG,
Unterpremstatten (AU)

( * ) Notice: Subject to any disclaimer, the term of this patent is extended or adjusted under 35 U.S.C. 154(b) by 8 days.

(21) Appl. No.: 10/573,454

(22) PCT Filed: Aug. 24, 2004

(86) PCT No.: PCT/EP2004/009455

§ 371 (c)(1),
(2), (4) Date: Oct. 2, 2006

(87) PCT Pub. No.: WO2005/036748

PCT Pub. Date: Apr. 21, 2005

(65) Prior Publication Data

US 2007/0103244 A1 May 10, 2007

(30) Foreign Application Priority Data

Sep. 26, 2003 (DE) ................. 103 45 131

(51) Int. Cl.
*H03K 3/26* (2006.01)
(52) U.S. Cl. .................. 331/111; 331/143; 331/135; 331/175; 327/132; 327/172
(58) Field of Classification Search .............. 331/135, 331/175, 36 C, 111, 143; 327/132, 172
See application file for complete search history.

(56) References Cited

U.S. PATENT DOCUMENTS

| 4,594,565 | A | 6/1986 | Barreras |
| 6,326,859 | B1 | 12/2001 | Goldman et al. |
| 6,774,644 | B2 * | 8/2004 | Eberlein ............ 324/682 |

FOREIGN PATENT DOCUMENTS

| DE | 43 40 924 | 10/1995 |
| WO | WO96/13903 | 5/1996 |
| WO | WO97/45956 | 12/1997 |

OTHER PUBLICATIONS

International Preliminary Examination Report on Patentability in Application No. PCT/EP2004/009455, dated Aug. 31, 2006.

* cited by examiner

*Primary Examiner*—Arnold Kinkead
(74) *Attorney, Agent, or Firm*—Fish & Richardson P.C.

(57) ABSTRACT

An RC oscillator circuit is disclosed. The RC oscillator circuit includes a current generator configured to generate a charge current. The RC oscillator circuit also includes an integrator having an input and an output, the input being connected to the current generator. The RC oscillator circuit also includes a comparator having a first input, a second input, and an output, the first input being connected to the output of the integrator and the second input being configured to supply a reference threshold. The RC oscillator circuit also includes a clock pulse generator connected to the output of the comparator and a reference generator configured to generate the reference threshold based on a supply voltage of the RC oscillator circuit.

20 Claims, 5 Drawing Sheets

RC-OSCILLATOR CIRCUIT

TECHNICAL FIELD

An RC oscillator circuit is disclosed.

BACKGROUND

In RC oscillators, the output frequency is determined by RC networks, in other words by resistors and capacitors.

An RC oscillator can for example be realised in that a capacitor is charged with a constant current, and the voltage resulting above the capacitor is compared to a threshold value or reference value. As soon as the voltage above the capacitor exceeds a predetermined threshold, the capacitor is rapidly discharged. Subsequently, renewed charging of the capacitor takes place. Thus it is primarily the capacitor's charging time constant which determines the clock pulse rate or frequency of the output signal of the arrangement. If necessary, the resulting sawtooth voltage can be converted to form a square-wave signal.

SUMMARY

In the described principle of an RC oscillator, there is however a problem in that the comparator, which compares the capacitor voltage with the reference voltage, is subject to substantial fluctuations in temperature. This results in an undesirable dependence of the oscillator's output frequency on the ambient temperature.

There is a further disadvantage in that usually the described oscillator principle depends to a significant degree on the supply voltage. Accordingly, fluctuations in the supply voltage also lead to significant undesirable fluctuations in the output frequency of the oscillator.

An RC oscillator circuit is disclosed in which the dependence of the output frequency on temperature and/or on the supply voltage is reduced.

In some embodiments, an RC oscillator circuit: includes a current generator for generating a charge current, an integrator with an input, which is coupled to the current generator, and with an output, a comparator comprising a first input which is connected to the output of the integrator, and comprising a second input for supplying a reference threshold, a clock pulse generator which is connected to an output of the comparator, and a reference generator, designed for generating the reference threshold, depending on a supply voltage of the RC oscillator circuit.

According to the principle proposed, one input of the comparator is coupled to an integrator which integrates a charge current, while a further input is coupled to a reference generator. In this arrangement, the reference generator provides the reference threshold depending on the supply voltage of the entire RC oscillator circuit.

By adjusting the reference threshold in relation to the supply voltage, a compensated reference threshold is provided so that the frequency emitted by the clock pulse generator of the oscillator remains largely independent of fluctuations in the supply voltage.

Preferably, the integrator comprises at least one capacitor which is charged by the charge current provided by the current generator.

Furthermore, preferably, a discharge device is provided which discharges the capacitor as soon as the voltage above the capacitor rises above the reference threshold. To this effect, the discharge device is preferably controlled by the comparator and/or the clock pulse generator.

As an alternative, the integrator can comprise two capacitors which are alternately charged and discharged. In this case, preferably a discharge device is provided for each capacitor. The charge currents for both capacitors can be fed to the capacitors by a common current generator, for example by way of a current mirror each.

Advantageously, the discharge current or discharge currents, too, can be provided by the current generator by way of still further current mirrors. In this arrangement it must be ensured that the time constants for discharge are clearly below those for charging the capacitors, so that, advantageously, quick discharge of the capacitors can be carried out.

In order to achieve still further improvement in the compensation of the reference threshold in the reference generator, it is further preferred that the reference generator be coupled to the integrator such that the reference threshold is generated depending on the actual voltage above the capacitor, of which there is at least one. To this purpose, the actual voltage above the capacitor, of which there is at least one, is preferably first integrated.

Thus, the reference threshold is generated depending both on the supply voltage of the oscillator and on the voltage above the capacitor, of which there is at least one.

Advantageously, dependence of the reference threshold on the supply voltage is achieved in that by means of a programmable voltage divider, the supply voltage is first divided down to a settable value and in that the signal obtained in this way is further processed in the reference generator for the purpose of generating the reference threshold.

According to the proposed improvement relating to generating the reference threshold depending on the voltage above the capacitor of the integrator, effects of the ambient temperature and/or effects which fluctuations in the supply voltage have on the charging time constant of the capacitor in the integrator can be taken into account and compensated for without any problems. As a result of this, advantageously, a comparator can be used whose requirements concerning speed and accuracy are quite modest.

Preferably, the reference generator is switched into the RC oscillator circuit such that a control system is created which controls the reference threshold depending on the actual circuit circumstances in the RC oscillator, so that any fluctuations in the supply voltage and/or variations in the charging time constant in the integrator can be "controlled away", i.e. compensated for.

Preferably, the reference generator comprises an integrating amplifier. Preferably, the integrating amplifier comprises an input which is coupled to the integrator, and comprises an output for supplying the reference threshold depending on the integrated voltage above the capacitor, of which there is at least one. This results in still more precise compensation of temperature fluctuations and supply voltage fluctuations as well as production-related fluctuations of the RC oscillator circuit.

Furthermore, the reference generator preferably comprises a differential amplifier which, at its output, provides the reference threshold depending on the difference between a voltage derived from the supply voltage, and the integrated voltage above the capacitor, of which there is at least one.

Preferably, the current generator comprises a voltage divider. Preferably, the voltage divider is connected to supply potential on the input side, and connected to a voltage converter/current converter on the output side. The voltage converter/current converter provides the charge current.

Advantageously, the voltage converter/current converter comprises a resistor.

Further details and advantageous embodiments of the proposed principle are the subject of the subordinate claims.

DESCRIPTION OF THE DRAWINGS

Below, the invention is explained in more detail by means of exemplary embodiments, with reference to several drawings.

The following are shown.

DETAILED DESCRIPTION

Figure 1:
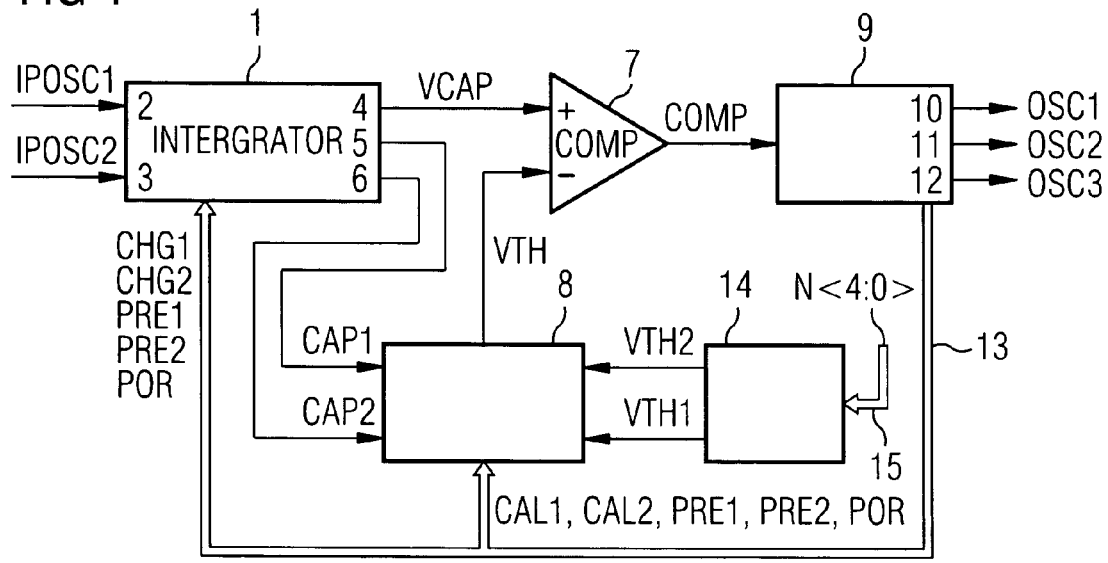
FIG. 1 a functional block diagram of an embodiment of an RC oscillator circuit according to the proposed principle.

FIG. 1 shows an RC oscillator circuit with reference to an embodiment according to the proposed principle. Provided is an integrator 1 with a first input 2 for supplying a charge current IPOSC1, and an input 3 for supplying a discharge current IPOSC2. Charge current and discharge current are provided by a current generator (not shown in FIG. 1). The integrator 1 comprises two capacitors which are alternately charged and discharged. The integrator 1 comprises three outputs 4, 5, 6. At output 4, a capacitor voltage in the form of a scanning signal is provided, while the respective actual current on the two capacitors is present at outputs 5 and 6. Output 4 is connected to a first input of a comparator 7. A second input of the comparator 7 is connected to an output of a reference generator 8. The reference generator 8 provides a reference threshold VTH. An output of the comparator 7 is connected to an input of a clock pulse generator 9 which in the present embodiment supplies clock pulse signals to three outputs 10, 11, 12, depending on the comparison between the capacitor voltage VCAP and the reference threshold VTH in the comparator 7. The clock pulse signals at the outputs 10, 11, 12 are indicated by the reference characters OSC1, OSC2, OSC3.

By way of a control bus 13, the clock pulse generator 9 is connected to respective control inputs of the integrator 1 and of the reference generator 8. The outputs 5, 6 of the integrator 1, at which outputs the respective capacitor voltages CAP1, CAP2 are present, are connected to inputs of the reference generator 8. A programmable voltage divider 14 provides output voltages VTH1, VTH2, depending on a supply voltage of the entire RC oscillator circuit and depending on a programming word, at an input 15 of the voltage divider 14.

The frequency divider 14 comprises a 32-step voltage divider at which the second auxiliary voltage VTH2 is provided on the output side. The voltage divider is programmable with 5 bits by means of which the output frequency of the oscillator is determined. By programming the 5 bits, both the voltage at which the capacitors are charged, and the clock pulse period at the output are influenced. The auxiliary voltages VTH1, VTH2 are both derived from the supply voltage of the circuit arrangement.

Controlled by the clock pulse generator 9, two capacitors in the integrator 1 are alternately charged and discharged. In the comparator 7, the scanned capacitor voltage VCAP, which is ramp-shaped, is compared to a reference threshold VTH. The reference threshold VTH among other things depends on the auxiliary voltages VTH1, VTH2. At every step of the capacitor voltage VCAP with the reference threshold VTH, the comparator provides pulses. In the clock pulse generator 9, the frequency of output signals OSC1, OSC2, OSC3 of the oscillator is determined from these pulses.

The reference threshold VTH depends on the capacitor voltages CAP1, CAP2 in the integrator 1, with said capacitor voltages being integrated in the reference generator 8. Furthermore, the reference threshold VTH depends on the supply voltage of the circuit, with said supply voltage being divided down in the voltage divider 14 with a programmable divider ratio.

The control bus 13 controls the integrator 1 and the reference generator 8 by means of a power-on-reset (POR) signal, a first changeover signal PRE1 and a second changeover signal PRE2. Further changeover signals CHG1, CHG2 are used to drive the integrator 1. Additional changeover signals CAL1, CAL2 are used to drive the reference generator 8.

Due to generation of the reference threshold which incorporates compensation, the proposed principle makes it possible to compensate for both fluctuations in temperature and fluctuations in the supply voltage with regard to the output frequency of the oscillator. The frequency of the output signals OSC1, OSC2, OSC3 of the oscillator is thus advantageously largely independent of the ambient temperature and of the supply voltage of the circuit.

The defined clock pulse period is obtained in that capacitors are charged with a constant current and in that the voltage ramp signal is compared with the reference threshold. Charge currents and discharge currents are provided in a way that does not depend on the temperature.

The function of the individual circuit blocks and their advantageous combined action is explained in more detail by way of examples with reference to the enclosed figures.

Figure 2:
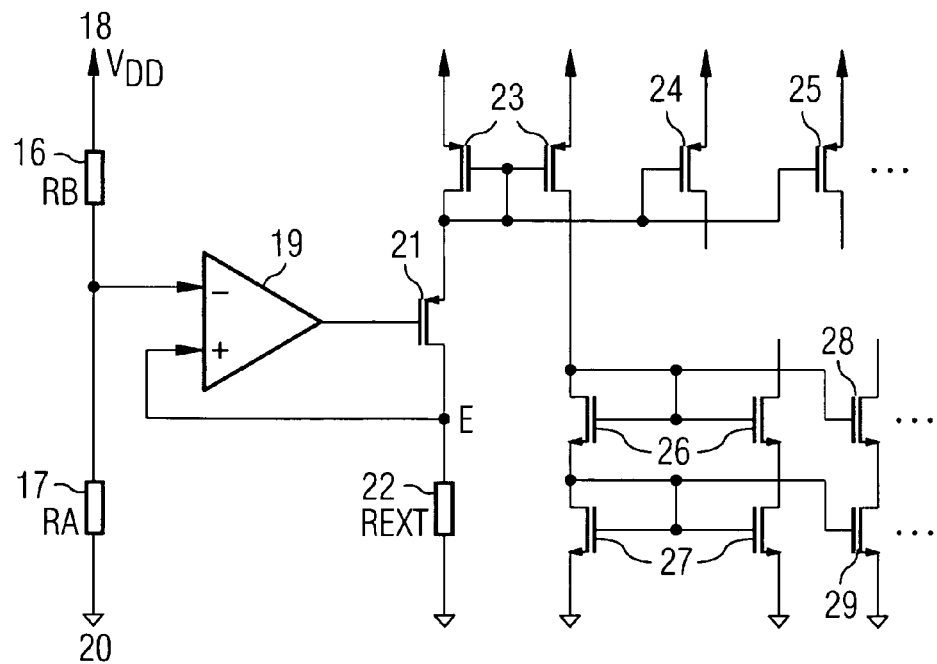
FIG. 2 an exemplary schematic circuit diagram of a current generator.

FIG. 2 shows an exemplary embodiment of a current generator whose inputs 2, 3 are coupled to the integrator 1, with said current generator being designed to generate a charge current IPOSC1 and to generate a discharge current IPOSC2. The current generator shown in FIG. 2 comprises a voltage divider 16, 17 which comprises a series connection with two resistors which are switched between the supply potential 18 and the reference potential 20. A tapping-off node between the resistors 16, 17 is connected to the inverting input of an operational amplifier 19. By way of its output, the operational amplifier 19 controls the gate connection of a field effect transistor 21. By way of an external resistor 22, the drain-connection of the transistor 21 is connected to reference potential 20 as well as to the non-inverting input of the operational amplifier 19. The source connection of the transistor 21 is connected to a multitude of current mirror circuits 23, 24, 25, 26, 27, 28, 29 which provide practically any number of reference currents. The output currents which can be tapped off at the current mirrors 23 to 29 are temperature-independent.

Part of the supply voltage VDD at the corresponding connection 18 is supplied to the negative input of the transconductance amplifier 19. The same voltage is present at the non-inverting input of the transconductance amplifier 19 and drops by way of the external resistor 22. In order to minimise so-called on-chip resistors serially to the external resistor 22, the connection between the resistor connection and the plus connection of the amplifier 19 is implemented externally. The output of the amplifier 19 controls the gate connection of a p-channel MOS field effect transistor. A negligible current is absorbed by the positive input connection of the resistor so that the resulting current which flows through the controlled section of the transistor 21 and thus also through the external resistor 22 is according to the equation:

$$I_{REXT} = V_{DD} \frac{R_A}{R_A + R_B} \frac{1}{R_{EXT}}$$

with $R_A$, $R_B$ denoting the resistance values of the voltage divider 16, 17, with $V_{DD}$ denoting the voltage at the supply potential connection 18, and with $R_{EXT}$ denoting the value of the external resistor 22.

If the mirror ratios of the current mirrors are included, then the general current which is generated by the current generator and which is independent of the temperature is:

$$I = V_{DD} \frac{R_A}{R_A + R_B} \frac{1}{R_{EXT}} \cdot k$$

With this constant current, a capacitance is charged.

Figure 3:
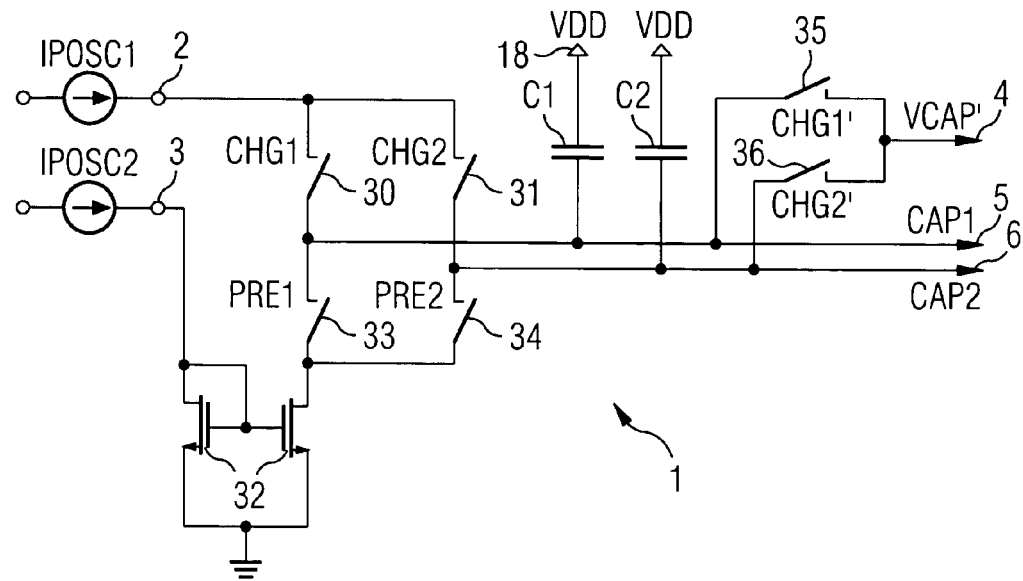
FIG. 3 an example of a schematic circuit diagram of the integrator of FIG. 1.

FIG. 3 shows an embodiment of an integrator 1. Two capacitors C1, C2 have been provided, each of which is connected via a switch 30, 31 to a connection with the input 2 of the integrator, and with a further connection each being connected to the supply potential connection 18. By way of a current mirror 32 and a further switch 33, 34 each, the input 3 is also connected to one each of the capacitors C1, C2. A connection each of capacitors C1, C2 is connected to an output 5, 6 each of the integrator, which are coupled to the reference generator 8. The output 4 of the integrator 1, to which the comparator 7 is connected, is connected to a capacitor C1, C2 each, by way of a switch 35, 36 each.

The two capacitors C1 and C2 are alternately charged and discharged. The switches 35, 36 are activated with control signals CHG1', CHG2' such that the output 4 is always connected to that capacitor C1, C2 which is being charged at the time. The changeover signals CHG1 and CHG2, which are provided by the clock pulse generator 9, select the charge phase of the capacitors C1, C2 by driving the switches 30, 31. The discharge signals PRE1 and PRE2, which drive the switches 33, 34, select the discharge phase of the respective capacitor.

In this example, the capacitors C1 and C2 are designed as respective gate capacitances of MOSFET, Metal Oxide Semiconductor Field Effect Transistor structures. In this arrangement, for each metal option in the integrated circuit several capacitors switched in parallel can be selected to change the clock pulse frequency.

The switches 30, 31, 33, 34, 35, 36 are transmission gates, each comprising an n-channel and a p-channel MOS field effect transistor. The switches 30, 31, 33, 34, 35, 36 are in the closed state if the respective control signal is High in relation to the n-channel transistor switch, and is Low in relation to the p-channel transistor switch.

The constant currents IPOSC1 and IPOSC2 at the inputs 2, 3 are used for charging the capacitor selected by the respective switch, or for discharging said capacitor. The current mirror 32 has a mirror ratio of 5:1 so that discharge of the capacitors C1, C2 takes place very rapidly in relation to the charge procedure. The charge is completely withdrawn from the respective capacitor before the next charge phase commences. The voltage during the discharge phase remains linear until the current mirror transistor on the output side leaves saturation, at which point the voltage becomes exponential.

When starting the entire oscillator circuit by means of the control signal POR, the capacitor C2 is charged to the differential voltage of the supply voltage VDD minus the auxiliary voltage VTH2 of the voltage divider 14, and the capacitor C1 is charged to VDD.

A clock pulse period at the output of the clock pulse generator 9 is composed of four clock pulse phases. During the first clock pulse phase the capacitor C1 is charged and the voltage at the capacitor C2 is constant. As soon as the voltage above the capacitor C1 intersects the first auxiliary threshold VTH1, the second clock pulse phase commences. During the second clock pulse phase, C1 continues to be charged, however C2 is already being discharged. The third clock pulse phase starts when the voltage above the capacitor C1 reaches the second auxiliary threshold VTH2. During the third clock pulse phase, the charge on the capacitor C1 remains constant, while C2 is being charged. When the voltage above the capacitor C2 intersects the auxiliary threshold VTH1, the fourth and last clock pulse phase commences. In the fourth clock pulse phase, C2 continues to be charged, however C1 is being discharged. The output of the reference generator 8, i.e. the output voltage VTH, periodically assumes the auxiliary threshold VTH1, provided by the divider 14, and a voltage value which results from correcting the threshold VTH2. The second auxiliary threshold VTH2 is adjusted in each half-period according to the error which the comparator 7 makes during commuting of the preceding half-period. The first auxiliary threshold VTH1 is constant and is used to split each half-period into two further sub-periods. In each instance, the error is estimated during the first phase of each half-period.

Figure 4:
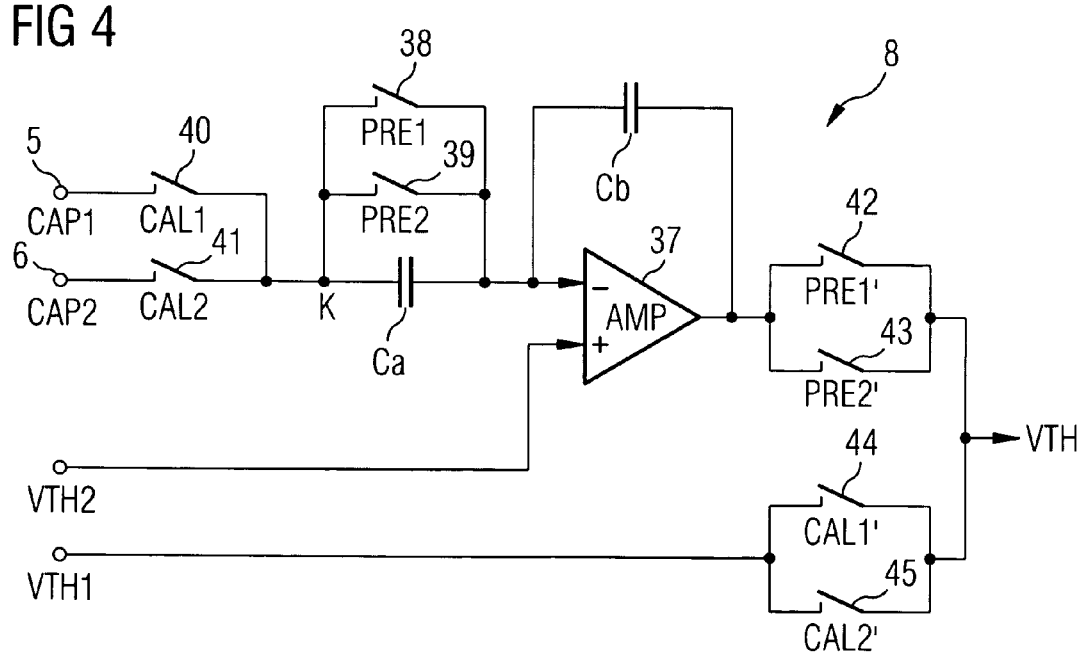
FIG. 4 an exemplary embodiment of a circuit of the reference generator shown in FIG. 1.

FIG. 4 shows an exemplary embodiment of the reference generator 8 which is shown in FIG. 1. At the output of the reference generator 8, the reference threshold VTH is provided which is compared in the comparator 7 to the respective capacitor voltage signal in the charge phase.

The reference generator 8 comprises a differential amplifier 37. For the purpose of supplying the auxiliary voltage VTH2, the non-inverting input of the differential amplifier 37 is connected to the output of the voltage divider 14. The inverting input of the differential amplifier 37 is connected to an input node K by way of a series capacitor CA, and is connected to the output of the differential amplifier 37 by way of a feedback capacitor CB. The series capacitor CA can be short-circuited by way of two series switches 38, 39 connected in parallel, with said series switches being driven by the clock pulse generator 9 by means of discharge signals PRE1, PRE2. The input node K is connected to the output 5 of the integrator 1 by way of a switch 40, and to the output 6 of the integrator 1 by way of a switch 41, which in each case supply the voltage CAP1, CAP2 by way of capacitors C1, C2. The switches 40, 41 are controlled by changeover signals CAL1, CAL2 from the clock pulse generator 9. The output of the differential amplifier 37 is connected to the output of the reference generator 8 by way of two switches 42, 43 connected in parallel, with said switches 42, 43 being controlled by discharge signals PRE1', PRE2'. Two further switches 44, 45, which are also connected in parallel, connect the voltage divider 14 via the connection for supplying the auxiliary voltage VTH1 to the output for providing the switching threshold VTH of the reference generator 8.

Below, the function of the circuit shown in FIG. 4 is explained, starting from an ideal case. In an ideal case, in which an ideal comparator is used, the value of the reference threshold VTH is equal to the value of the auxiliary thresholds VTH1 and VTH2. In a real case however, the comparator switches at the point where the ramp voltage attains the value of the second auxiliary threshold VTH2 plus an error voltage VERR. An error in the clock pulse period results, which error is calculated from the product of the voltage error VERR and the quotient from the capacity C and the current I, where C represents the charging capacity and I represents the charge current. In the next half-period, VTH first assumes the value of the first auxiliary threshold VTH1. Subsequently, the reference threshold VTH is arrived at, according to the equation:

$$VTH = VTH2 - \frac{CA}{CB} \cdot VERR$$

CA designates the capacity of the series capacitor CA, and CB designates the capacity of the feedback capacitor CB of FIG. 4.

This results in an error in the clock pulse period of $$\left(1 - \frac{CA}{CB}\right) \cdot VERR \cdot \frac{C}{I}$$

If the comparator error remains constant, according to the principle proposed, the error of the clock pulse period is reduced to the value represented by the following equation, after going through a number N of steps:

$$\left(1 - \frac{CA}{CB}\right)^N VERR \frac{C}{I}$$

Figure 5:
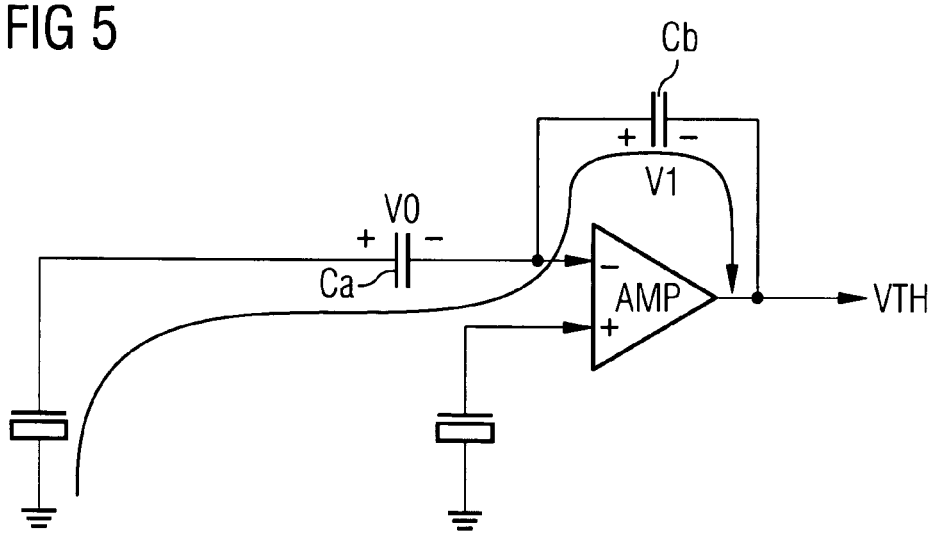
FIG. 5 a simplified schematic circuit diagram of the reference generator shown in FIG. 4 for explaining the way it functions.
Figure 6:
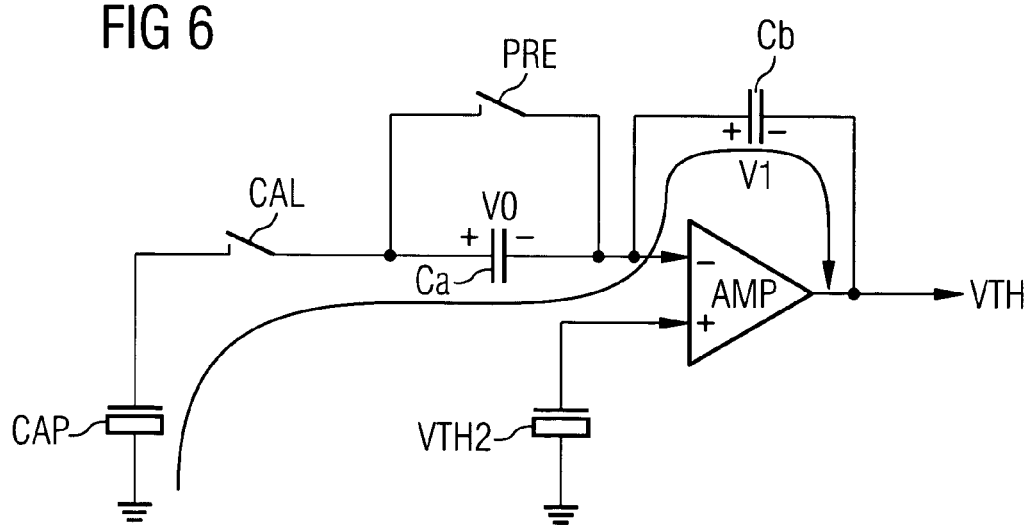
FIG. 6 a further schematic circuit diagram for explaining the way the reference generator shown in FIG. 4 functions.

FIGS. 5 and 6 show simplified schematic circuit diagrams starting with FIG. 4, by means of which the function of the circuit in FIG. 4 is explained. In this process, it should first be assumed that in a first time interval T between the points in time T0 and T1, T0<T<T1, the voltage V1 above the feedback capacitor CB should equal 0. In the first time interval, the resulting ratios are

V0=0, CAL=0, with V0 representing the voltage above the series capacitor CA, and with CAL representing the switching signal for the switch, shown in FIG. 6, which is connected in series with the capacitor CA.

A second time interval T1<T<T2 is examined. The voltage above the replacement voltage source CAP shown in FIG. 6 is CAP=VTH2+VERR. From this follows:

V0=VTH2+VERR−VTH2=VERR.

The following results:

Q0=CA×V0=CA×VERR.

The following applies: If the switch, controlled by signal CAL closes and the parallel switch to the series capacitor CA (the switch signal being designated PRE) is opened, a current which flows through CA supplies the charge Q0. The same current also flows through CB, as shown in FIG. 5, because the input of the amplifier is highly resistive. From this follows:

$$Q0 = Q1,$$

so that $$V1' = \frac{Q0}{CB} = \frac{CA}{CB} \cdot VERR$$

and $$VTH' = VTH2 - \frac{CA}{CB} \cdot VERR$$

In a third time interval T2<T<T3 the following applies: The switch, controlled by signal CAL is open, the capacitor CB receives the charge and its voltage V1', while V0 above CA equals 0.

In a fourth interval T3<T<T4 the following applies:

$$CAP = VTH' + VERR$$
$$= VTH2 - \frac{CA}{CB} \cdot VERR + VERR$$
$$= VTH2 + VERR\left(1 - \frac{CA}{CB}\right)$$

$$V0 = VERR\left(1 - \frac{CA}{CB}\right)$$

$$Q0 = CA \cdot VERR\left(1 - \frac{CA}{CB}\right)$$

$$V1'' = V1' + \frac{Q0}{CB}$$
$$= \frac{CA}{CB} VERR + \frac{CA}{CB} VERR \cdot \left(1 - \frac{CA}{CB}\right)$$
$$= VERR\left[2\frac{CA}{CB} - \left(\frac{CA}{CB}\right)^2\right]$$

$$VTH'' = VTH2 - VERR \cdot \left[2\frac{CA}{CB} - \left(\frac{CA}{CB}\right)^2\right]$$

In a fifth interval T4<T<T5, the same applies as in interval 3, apart from the fact that CB is supplied with the voltage V1".

In a sixth interval, the following applies: T5<T<T6

$$CAP = VTH'' + VERR$$
$$= VTH2 - VERR\left[-1 + 2 \cdot \frac{CA}{CB} - \left(\frac{CA}{CB}\right)^2\right]$$
$$= VTH2 + VERR\left(1 - \frac{CA}{CB}\right)^2$$

$$V0 = VERR\left(1 - \frac{CA}{CB}\right)^2$$

$$Q0 = CA \cdot VERR\left(1 - \frac{CA}{CB}\right)^2$$

-continued $$VI'' = VI' + \frac{Q0}{CB}$$

$$= VERR\left[2\frac{CA}{CB} - \left(\frac{CA}{CB}\right)^2\right] + \frac{CA}{CB}VERR\left(1 - \frac{CA}{CB}\right)^2$$

$$= VERR\left[3\frac{CA}{CB} - 3\left(\frac{CA}{CB}\right)^2 + \left(\frac{CA}{CB}\right)^3\right]$$

$$VTH''' = VTH2 - VERR\left[3\frac{CA}{CB} - 3\left(\frac{CA}{CB}\right)^2 + \left(\frac{CA}{CB}\right)^3\right], \text{ etc.}$$

Figure 7:
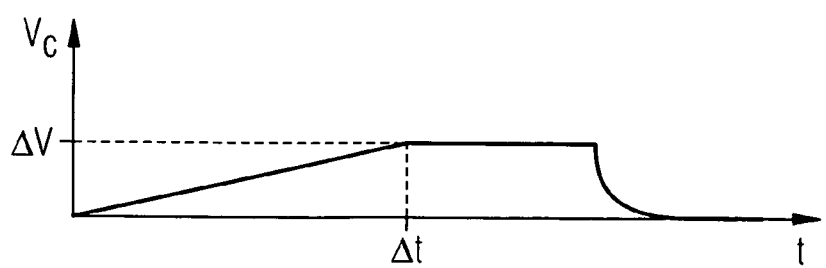
FIG. 7 an example of a diagram of a charge curve of a capacitor in the integrator.

By means of a diagram, FIG. 7 shows the voltage over time, at which the capacitors C1, C2 shown in FIG. 3 are charged. Note that with the voltage divider 14, which comprises a multiplexer, it is not only possible to change the voltage at which the capacitors are charged, but also to change the clock pulse period.

Figure 8:
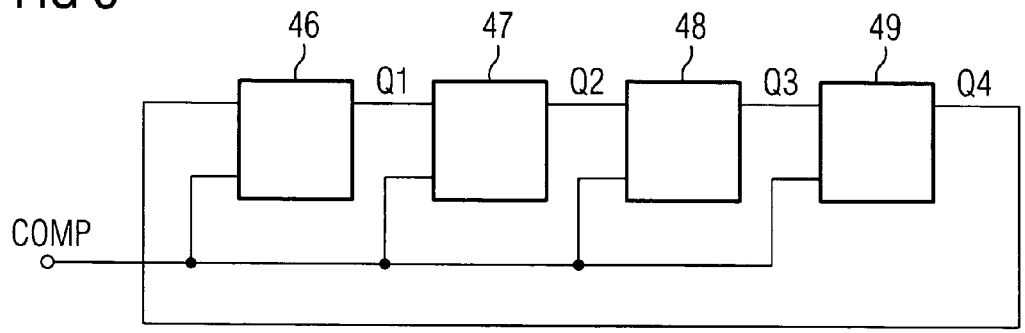
FIG. 8 an embodiment of a shift register for application in the clock pulse generator shown in FIG. 1.

FIG. 8 shows a shift register which is encompassed by the clock pulse generator 9. The shift register comprises four register cells 46, 47, 48, 49 which are interconnected in a ring-shaped manner, with each register cell being clock pulsed with the output signal of the comparator 7. For each clock pulse period, four clock pulse phases are provided. Each clock pulse phase starts with a switch pulse of the comparator 7. In an initialisation state, the register cells 46 and 47 are precharged with a logical 1, while the register cells 48 and 49 are precharged with a logical 0. Consequently, the starting state of the shift register is 1100. The internal state of the shift register changes with each pulse on the COMP signal of the comparator.

Consequently, the sequence of states of the shift register is:
1100
0110
0011
1001
1100 etc.

Figure 9:
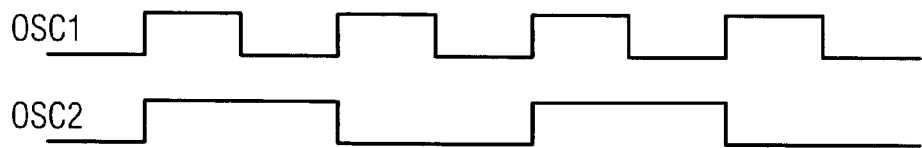
FIG. 9 exemplary output signals of the clock pulse generator shown in FIG. 1.

The internal states of the shift register 46, 47, 48, 49 generate four auxiliary signals of which the periodic square-wave signal OSC1 at the output of the clock pulse generator 9 is composed. The further output signals OSC2 and OSC3 are arrived at by dividing the output signal OSC1 by 2, or by 32 respectively. FIG. 9 shows an example of the clock pulse gradients of the output signals OSC1 and OSC2.

It is important to note that all auxiliary signals for controlling the four phases of a clock pulse period are generated from the internal states of the shift register 46, 47, 48, 49 of FIG. 8 by logic operations.

Figure 10:
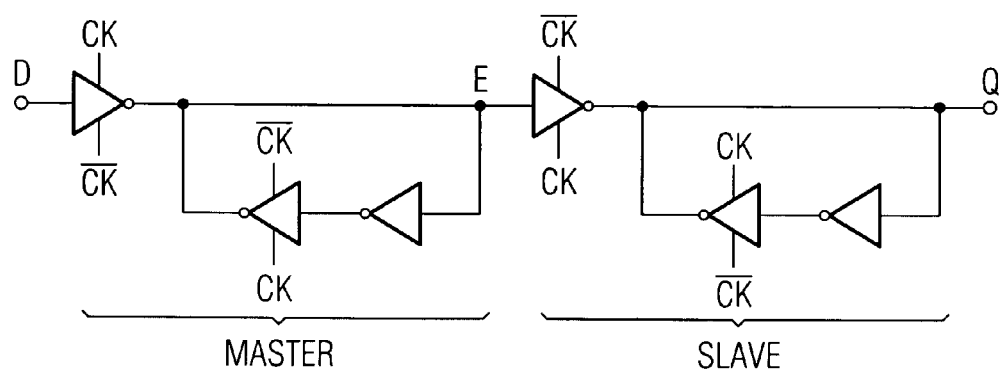
FIG. 10 a D-flip-flop by means of a schematic circuit diagram for application in the clock pulse generator shown in FIG. 1.
Figure 11:
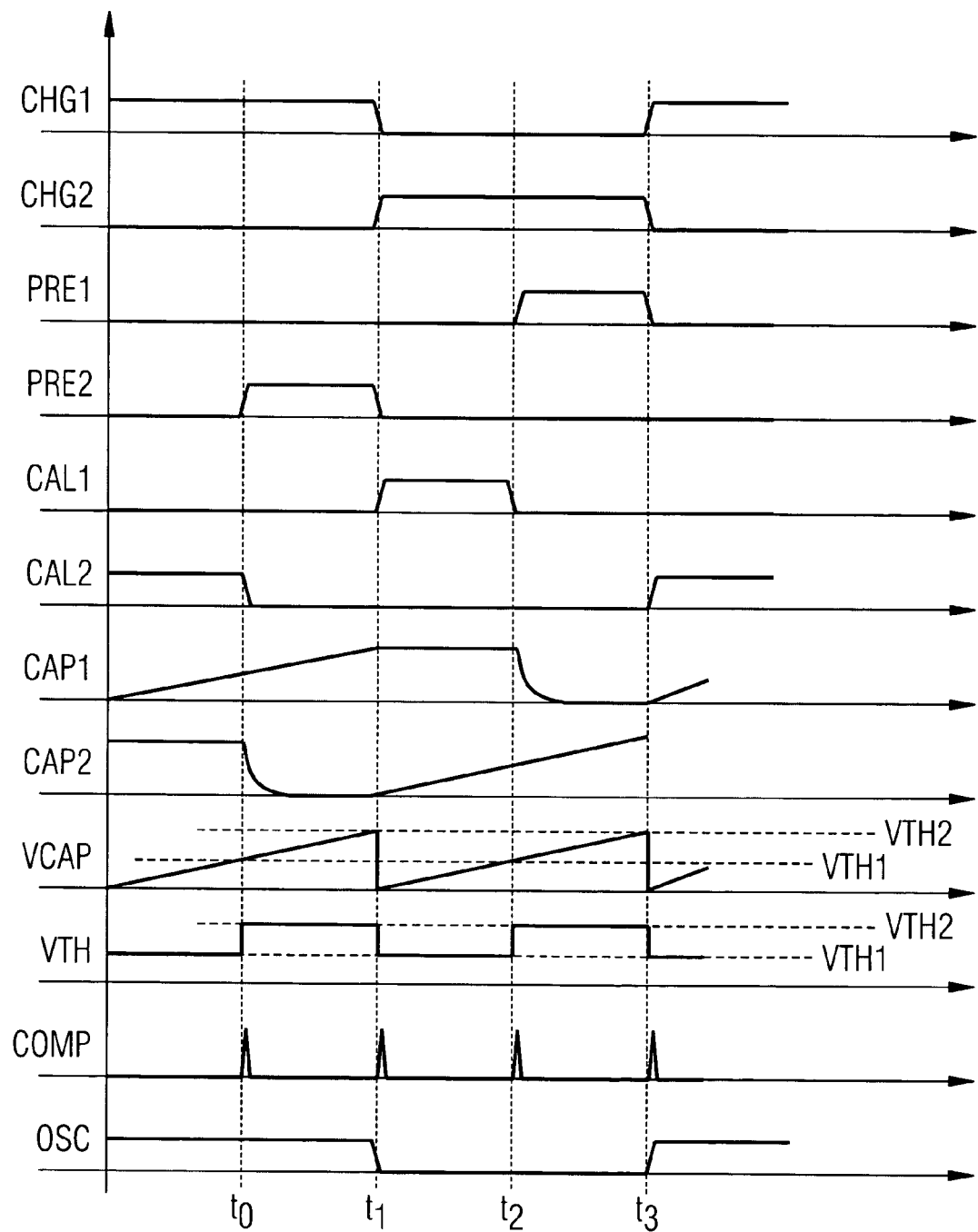
FIG. 11 the variation in time of selected signals for explaining the way the proposed principle functions, with reference to the embodiment shown in FIG. 1.

FIG. 10 is an example of a schematic circuit diagram of a positive, flank-triggered register by means of a D-flip-flop with master-slave structure.

For a better understanding of the function of the circuits shown in FIGS. 1 to 4, FIG. 11 shows the time gradients of selected signals. The switching signals CHG1 and CHG2 are used for controlling switches 30 and 31 in the integrator 1 of FIG. 3, with said switching signals being provided by the clock pulse generator 9. The signals PRE1 and PRE2 are used to switch the discharge switches 33 and 34. The switching signals CAL1 and CAL2 are used to control the scanning switches 40 and 41 in the reference generator 8. CAP1 and CAP2 designate the capacitor voltages at the outputs 5, 6 of the integrator 1. VCAP designates the voltage gradient at the output 4 of the integrator 1, wherein in every case the charging phases of the capacitors C1, C2 are switched to the output. VTH shows the signal gradient of the reference threshold which is provided by the reference generator 8. At the beginning of each of the four phases of a clock pulse period, the output signal COMP shows a pulse. OSC designates the output signal OSC1 of the clock pulse generator 9. It is shown that a clock pulse period of the RC oscillator comprises exactly four clock pulse phases.

For example a power-on-reset signal, a scanning signal for 5 programming bits, as well as the 5 programming bits for specifying the desired output frequency are provided as input signals of the proposed integrated RC oscillator. Three clock pulse frequencies, four n-type and two p-type currents are the output signals. Furthermore, a connection pin for connection to an external resistor is provided, which provides the temperature-independent current.

Of course it is within the scope of the invention to also use other embodiments of the oscillator circuit, which embodiments differ from those shown.

The invention claimed is:

1. An RC oscillator circuit, comprising:
a current generator configured to generate a charge current;
a first integrator having an input and an output, the input being connected to the current generator;
a comparator having a first input, a second input, and an output, the first input being connected to the output of the first integrator and the second input being configured to supply a reference threshold;
a clock pulse generator connected to the output of the comparator; and
a reference generator comprising a second integrator configured to integrate an output voltage from the first integrator,
wherein the reference generator is configured to generate the reference threshold based on the integrated output voltage and a supply voltage of the RC oscillator circuit, and
wherein the first integrator comprises a first capacitor and a second capacitor which are alternately charged and discharged.

2. An RC oscillator circuit, comprising:
a current generator configured to generate a charge current;
an integrator having an input and an output, the input being connected to the current generator, the integrator comprising at least one capacitor;
a comparator having a first input, a second input, and an output, the first input being connected to the output of the integrator and the second input being configured to supply a reference threshold;
a clock pulse generator connected to the output of the comparator; and
a reference generator coupled to the integrator, the reference generator being configured to generate the reference threshold based on a supply voltage of the RC oscillator circuit, and a voltage at a node connected to the capacitor.

3. The RC oscillator circuit of claim 1, wherein the first integrator further comprises a discharge device configured to discharge at least one of the first capacitor and the second capacitor.

4. The RC oscillator circuit of claim 1, wherein the reference generator comprises an integrating amplifier, the integrating amplifier having an input and an output, the input being coupled to the first integrator and the output being configured to supply the reference threshold based on an integrated voltage at a node connected to at least one of the first capacitor and the second capacitor relative to the supply voltage.

5. The RC oscillator circuit of claim 2, wherein the reference generator further comprises a differential amplifier configured to generate the reference threshold based on a difference between a voltage derived from the supply voltage and the voltage at the node connected to the at least one of the first capacitor and the second capacitor.

6. An RC oscillator circuit, comprising:
a current generator configured to generate a charge current;
a first integrator having an input and an output, the input being connected to the current generator;
a comparator having a first input, a second input, and an output, the first input being connected to the output of the first integrator and the second input being configured to supply a reference threshold;
a clock pulse generator connected to the output of the comparator; and
a reference generator comprising a second integrator configured to integrate an output voltage from the first integrator,
wherein the reference generator is configured to generate the reference threshold based on the integrated output voltage and a supply voltage of the RC oscillator circuit,
wherein the first integrator comprises a first capacitor and a second capacitor which are alternately charged and discharged, and
wherein the current generator comprises a voltage divider having an input connected to a supply potential connection and an output connected to a voltage-to-current converter.

7. The RC oscillator circuit of claim 6, wherein the voltage-to-current converter comprises a resistor.

8. The RC oscillator circuit of claim 1, wherein the current generator is coupled to the first integrator by at least one current mirror.

9. The RC oscillator circuit of claim 2, where the integrator further comprises a discharge device configured to discharge the at least one capacitor.

10. The RC oscillator circuit of claim 2, wherein the reference generator comprises an integrating amplifier, the integrating amplifier having an input and an output, the input being coupled to the integrator and the output being configured to supply the reference threshold based on an integrated voltage at a node connected to the at least one capacitor.

11. The RC oscillator circuit of claim 10, wherein the reference generator comprises a differential amplifier configured to generate the reference threshold based on a difference between a voltage derived from the supply voltage and the voltage at the node connected to the at least one capacitor.

12. The RC oscillator circuit according to claim 2, wherein the current generator comprises a voltage divider having input connected to a supply potential connection and an output connected to a voltage-to-current converter.

13. The RC oscillator circuit of claim 12, wherein the voltage-to-current converter comprises a resistor.

14. The RC oscillator circuit of claim 2, wherein the current generator is coupled to the integrator by at least one current mirror.

15. The RC oscillator circuit of claim 6, wherein the first integrator further comprises a discharge device configured to discharge at least one of the first capacitor and the second capacitor.

16. The RC oscillator circuit of claim 6, wherein the reference generator comprises an integrating amplifier, the integrating amplifier having an input and an output, the input being coupled to the first integrator and the output being configured to supply the reference threshold based on an integrated voltage at a node connected to at least one of the first capacitor and the second capacitor relative to ground.

17. The RC oscillator circuit of claim 16, wherein the reference generator comprises a differential amplifier configured to generate the reference threshold based on a difference between a voltage derived from the supply voltage and the voltage at the node connected to the at least one of the first capacitor and the second capacitor.

18. The RC oscillator circuit of claim 6, wherein the current generator is coupled to the first integrator by at least one current mirror.

19. The RC oscillator circuit of claim 1, further comprising a control bus connecting the clock pulse generator to respective control inputs of the first integrator and of the reference generator.

20. The RC oscillator circuit of claim 2, further comprising a control bus connecting the clock pulse generator to respective control inputs of the integrator and of the reference generator.

* * * * *

UNITED STATES PATENT AND TRADEMARK OFFICE
CERTIFICATE OF CORRECTION

PATENT NO. : 7,474,162 B2  Page 1 of 1
APPLICATION NO. : 10/573454
DATED : January 6, 2009
INVENTOR(S) : Paolo D'Abramo et al.

It is certified that error appears in the above-identified patent and that said Letters Patent is hereby corrected as shown below:

On the Title Page
Item (73) Assignee, line 2, "(AU)" should read -- AT --.

Signed and Sealed this

Tenth Day of March, 2009

JOHN DOLL
*Acting Director of the United States Patent and Trademark Office*